United States Patent [19]

Stewart et al.

[11] Patent Number: 5,508,629

[45] Date of Patent: * Apr. 16, 1996

[54] METHOD AND APPARATUS FOR INSPECTING INTEGRATED CIRCUIT PROBE CARDS

[75] Inventors: John P. Stewart, Seattle; Ronald C. Seubert, Issaquah; Donald B. Snow, Mercer Island, all of Wash.

[73] Assignee: Applied Precision, Inc., Mercer Island, Wash.

[*] Notice: The portion of the term of this patent subsequent to Apr. 17, 2007, has been disclaimed.

[21] Appl. No.: 689,294

[22] Filed: Apr. 22, 1991

Related U.S. Application Data

[62] Division of Ser. No. 487,434, Mar. 1, 1990, Pat. No. 5,060,371, which is a division of Ser. No. 254,269, Oct. 5, 1988, Pat. No. 4,918,374.

[51] Int. Cl.⁶ ............................. G01R 1/06; G01R 31/00
[52] U.S. Cl. ......................... 324/758; 324/158.1
[58] Field of Search ............... 324/158 P, 500, 324/697, 158 F, 758, 158.1, 158 R; 358/101; 29/827, 846, 850

[56] References Cited

U.S. PATENT DOCUMENTS

| | | | |
|---|---|---|---|
| 3,651,401 | 3/1972 | Cooney | 324/158 F |
| 3,849,728 | 11/1974 | Evans | 324/72.5 |
| 3,882,597 | 5/1975 | Chayka et al. | 29/827 |
| 3,905,098 | 9/1975 | Garretson et al. | 29/827 |
| 3,996,517 | 12/1976 | Fergason et al. | 324/72.5 |
| 4,266,191 | 5/1981 | Spano et al. | 324/158 F |
| 4,382,228 | 5/1983 | Evans | 324/158 P |
| 4,419,013 | 12/1983 | Heimer | 356/401 |
| 4,677,474 | 6/1987 | Sato et al. | 324/158 P |
| 4,724,283 | 2/1988 | Shimada et al. | 361/414 |
| 4,780,836 | 10/1988 | Miyazaki et al. | 324/158 P |
| 4,786,867 | 11/1988 | Yamatsu | 324/158 F |
| 4,820,975 | 4/1989 | Diggle | 324/158 F |
| 4,864,227 | 9/1989 | Sato | 324/158 F |
| 4,929,893 | 5/1990 | Sato et al. | 324/158 F |
| 4,947,114 | 8/1990 | Schindlbeck | 324/158 R |

*Primary Examiner*—Ernest F. Karlsen
*Attorney, Agent, or Firm*—Michael J. Folise

[57] ABSTRACT

A method and apparatus for inspecting integrated circuit probe cards in which the probe points of the probe card are scanned across a checkplate having a conductivity transition border. The impedances between the probe points and the checkplate as they cross the conductivity transition border are measured to determine when the probe points cross the border. The positions of the probe card when each of the probe points crosses the border are measured to determine the positions of the probe points relative to each other. In one embodiment, the checkplate is formed by a square conductive plate having three quadrants of insulated material and a single quadrant of conductive material mounted on its upper surface. These conductive strips connected to the conductive plate are positioned between the quadrants of insulative material to form the conductivity transition border. In other embodiments, multiple parallel strips or a single dot of conductive material are surrounded by insulative material.

6 Claims, 9 Drawing Sheets

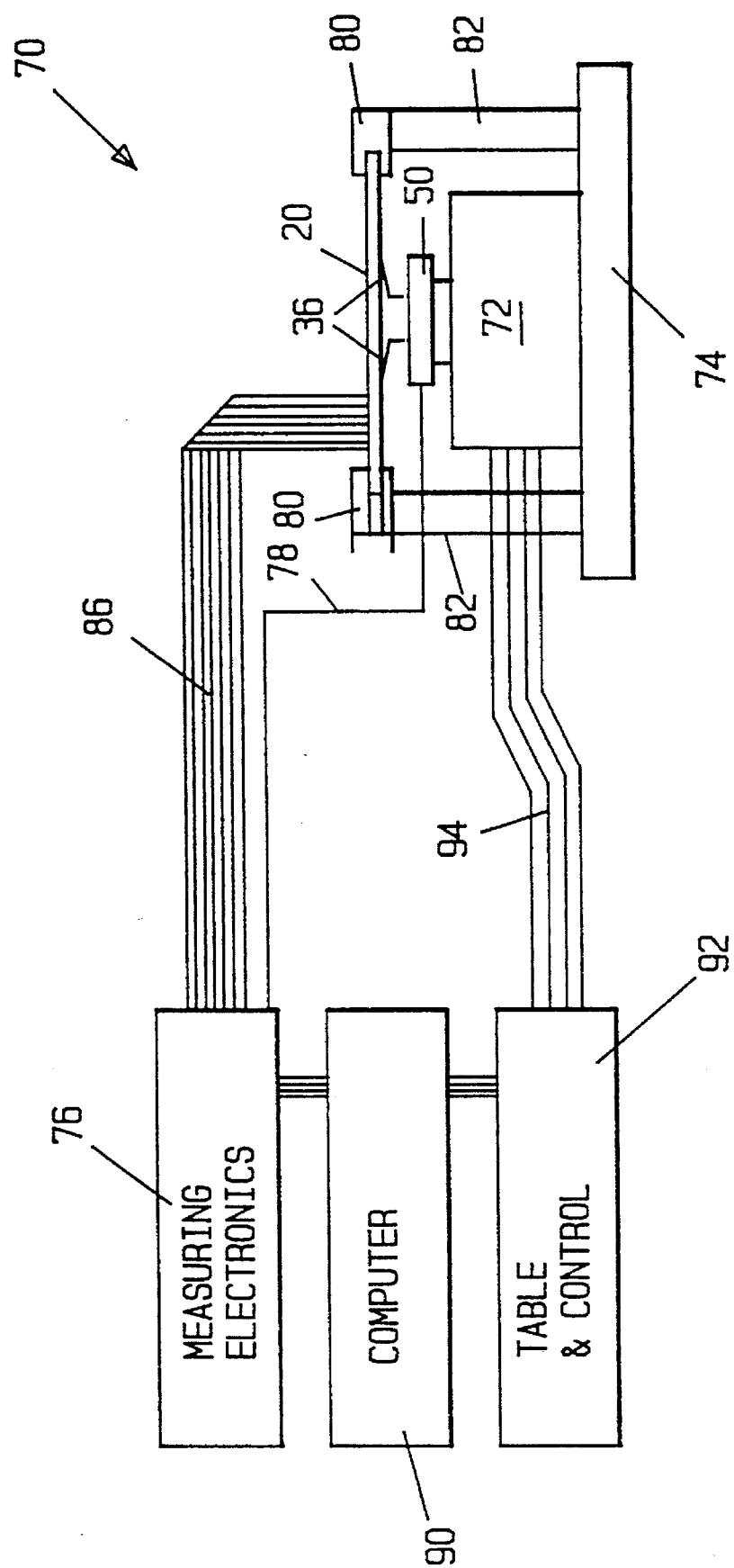

METHOD AND APPARATUS FOR INSPECTING INTEGRATED CIRCUIT PROBE CARDS

This application is a division of U.S. patent application Ser. No. 07/487,434, filed Mar. 1, 1990, now U.S. Pat. No. 5,060,371, which is a division of U.S. Ser. No. 07/254,269, filed Oct. 5, 1988, now U.S. Pat. No. 4,918,374.

FIELD OF THE INVENTION

This invention relates to the field of testing integrated circuits during manufacture, and more particularly, to a method and apparatus for inspecting probe cards that are used to make contact with integrated circuits so that the integrated circuits can be tested while they are still part of the wafer on which they were formed.

BACKGROUND ART

In the semiconductor industry, there is a need to performance test individual integrated circuits, or "chips," while they are still in their parent wafer. In order to conduct performance tests on these chips, electrical contact must be made with bonding pads formed on the integrated circuit so that appropriate electrical stimulus can be applied to the chips and their respective responses can be determined. A device known as a "probe card" is normally used to make contact with the bonding pads of integrated circuits to allow performance testing.

Probe cards consist of an array of resilient conductors or wires terminating in an array of respective probe points. The wires forming the array of probe points are mounted on a printed circuit board, and the probe points are positioned so that they are precisely aligned with the integrated circuit's bonding pads. A different probe card is generally used for each type of integrated circuit since the bonding pad patterns vary with each integrated circuit. During use, an integrated circuit is positioned below the probe array, with the probe points aligned with respective bonding pads. The wafer and probe array are then brought together so that the probe points slightly deflect as they make contact with their respective bonding pads. The electrical stimuli and responses to the stimuli are conducted through the probe card wires to suitable electronic testing devices. The probe card and integrated circuit are then separated, and the probe points are aligned with another integrated circuit on the wafer to repeat the test until all of the integrated circuits on the wafer have been tested.

In order to maximize production efficiency and minimize the possibility of chip damage, it is desirable to inspect the probe cards to verify their required electrical characteristics and probe point alignment accuracy. The inspection should be done prior to the card's first use and at subsequent intervals to check for wear, damage, or other degradation.

Some of the necessary electrical and mechanical inspections can be performed by currently available devices. For example, machines are commercially available to measure the planarization of probe cards. The term "planarization" refers to the degree of alignment of the probe points in the vertical direction so that they occupy a common horizontal plane. A lack of planarization causes some of the probe wires to bend excessively in order to ensure that all of the probe points make contact with the integrated circuit. This excessive bending of probe wires can cause the probe points to excessively scrape the metal bonding pads thus ruining the chip and producing accelerated wear and oxide buildup on the probe points. Conventional probe card planarization measuring devices function by positioning a flat metal plate adjacent and parallel to the probe point array and then bringing the plate and array together in small increments. After each incremental movement, the electrical continuity between each probe point and the metal plate is measured. The position at which a point makes contact with the plate and initiates continuity determines its position along the Z axis relative to the other points. The plate and array are progressively brought together until all of the probe points have made contact with the plate, thus allowing the Z axis positions of all of the probe points to be determined.

An important electrical characteristic of probe cards is the contact resistance of their probe points. The contact resistance of the probe points gradually increases with use as metal oxides and other contamination adhere to the probe points. Contact resistance is thus measured to determine when the probe points must be cleaned. Contact resistance can be measured by connecting an ohm meter in series with the probe wires as they make contact with the plate of a probe card planarization measuring device.

Another electrical parameter of probe cards which can be measured with an ohm meter is the "board leakage." The "board leakage" is caused by contamination of the probe card and is inversely proportional to the resistance between the probe wires of the card when the wires are isolated from each other and from the planarization plate.

One very important parameter of a probe card that must be measured is the alignment of the probe points along the X and Y axes relative to the bonding pads. The X and Y axes alignment of probe points are currently measured optically by positioning the probe array over its corresponding integrated circuit. The probe array is placed in contact with the bonding pads of the integrated circuit, and the probe wires are deflected an appropriate amount. The positions of the probe points relative to respective bonding pads are then examined visually through a microscope.

This conventional approach to inspecting the probe point alignment along the X and Y axes exhibits a number of limitations. First, since the integrated circuit itself is used to assess the probe point alignment, the probe point alignment cannot be inspected until a corresponding integrated circuit or its artwork has been produced. Thus, it is not possible to inspect the probe cards for an integrated circuit until the integrated circuit is in production. Second, the conventional technique is inherently subjective and labor-intensive, with its attendant expense and susceptibility for errors. Although the need exists for automatically measuring probe point alignment along the X and Y axes, a suitable machine has not been developed.

As mentioned above, it is currently not possible to inspect probe point alignment until a corresponding integrated circuit or its artwork has been produced. It is also not possible to manufacture probe cards using conventional techniques until corresponding integrated circuits or metalization artwork have been produced. Probe cards are currently manufactured by mounting a wafer containing a large number of integrated circuits and a sheet of Mylar on the same table. An operator aligns a viewing aperture with each of the bonding pads on an integrated circuit of the wafer, and punches a hole in the Mylar at a location that is spaced a fixed distance from the optical aperture. An array of holes is thus punched in the Mylar sheet at locations corresponding to the positions of the bonding pads of the integrated circuit. Pointed probe wires are then placed through each of the holes in the Mylar and are secured to a printed circuit card by a suitable adhesive. After the adhesive has hardened, the Mylar sheet is removed, leaving the wires at their proper locations. The wires are then sanded to make their points flat and the array planar. An integrated circuit is thus a critical component in the manufacture of the Mylar sheet used to position the probe wires for the corresponding probe card, thereby making it impossible to manufacture probe cards until corresponding integrated circuits or its artwork have been produced.

DISCLOSURE OF THE INVENTION

It is an object of the present invention to provide automatic inspection of probe point alignment for integrated circuit probe cards.

It is another object of the invention to provide automatic inspection of essentially all probe card electrical parameters with a single inspection machine.

It is another object of the invention to allow inspection of probe point alignment before corresponding integrated circuits or their artwork have been produced.

It is another object of the invention to provide an automatic inspection system that, in addition to inspecting probe point alignment, can also measure the transverse dimensions of the portion of the probe points that make contact with the plate or chip.

It is another object of the invention to provide a means of automatically measuring the position and orientation of the probe array relative to indexing features on the probe card so that this positional information can be used during the setup of a probe machine.

It is another object of the invention to provide a means of measuring the X-Y locations of the probe points when they are vertically deflected into the same positions they are in when being used in chip testing so that any lateral point movement that occurs during the vertical deflection is taken into account during the X-Y measurements.

It is another object of the invention to provide a means of facilitating the repairing, or bending, of the probes into proper alignment.

It is still another object of the invention to automatically generate a reference file of probe point locations to assist in aligning the probe card with integrated circuits during testing of a wafer of integrated circuits.

It is a further object of the invention to allow probe cards to be manufactured before their corresponding integrated circuits or artwork have been produced.

These and other objects of the invention are provided by a system for inspecting an integrated circuit probe card having a plurality of probe wires terminating in respective probe points arranged in a probe point array. The system includes an X-Y table on which a checkplate is mounted. The checkplate has a planar measurement surface in which a conductivity transition border is formed so that the resistance between the surface of the checkplate and a measurement terminal varies between two values on opposite sides of the border. The probe card is mounted adjacent the checkplate, with its probe points contacting the measurement surface. A control system drives the X-Y table to cause the probe point array to scan across the measurement surface of the checkplate from one side of the conductivity transition border to the other. An impedance measuring circuit measures the impedance between each probe wire and the measurement terminal of the checkplate to identify when each of the probe points reaches the border. The horizontal location of the checkplate relative to the probe card when each of the probe points crosses the conductivity transition border is measured to determine the locations of the probe points relative to each other. In one embodiment, the checkplate includes a conductive base, a region of conductive material mounted on the base, and a layer of insulative material mounted on the base and surrounding the conductive material. The measurement terminal is thus formed by the conductive base, and the conductivity transition border is formed by the interface between the conductive material and the insulative material. The region of conductive material may be in the form of a dot having a maximum transverse dimension that is smaller than the distance between adjacent probe points of the probe card. Alternatively, the region of conductive material may have a linear periphery so that the conductivity transition border forms a straight line. A second linear conductivity border extending in a direction that is perpendicular to the first linear conductivity border may also be mounted on the base. As a result, the positions of the probe points along one axis of a Cartesian coordinate system can be determined by scanning the probe points across the first linear border. The positions of the probe points along the other axis of the Cartesian coordinate system can be determined by scanning the probe points across the second linear border. In the event that there are two conductivity transition borders parallel to each other, the control system can determine the location of the probe points by averaging the positions of the probe card when the probe points reach the first conductivity border with the positions of the probe card when the probe points leave the second conductivity border. The transverse dimension of the probe points can also then be determined by calculating the difference between the positions of the probe card when the probe points reach the first conductivity border with the positions of the probe card when the probe points leave the second conductivity border and deducting the lateral dimension between the conductivity transition borders.

BRIEF DESCRIPTION OF THE DRAWINGS

FIG. 5 is a mechanical and electrical schematic illustrating an embodiment of an inspection machine using the checkplate of FIG. 3.

BEST MODE FOR CARRYING OUT THE INVENTION

Figure 1:
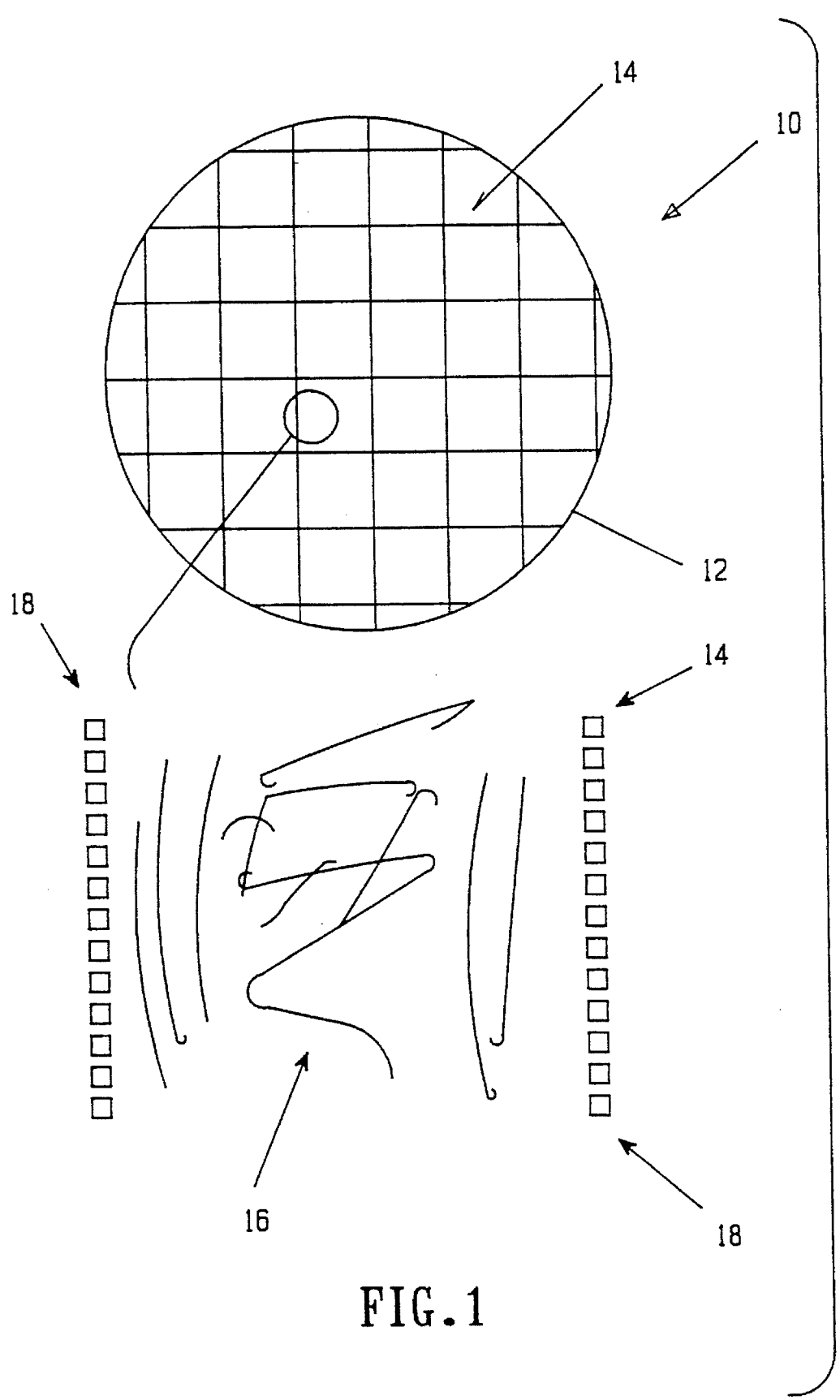
FIG. 1 is a partially exploded plan view of a semiconductor wafer having a large number of integrated circuits formed thereon.

A typical semiconductor wafer 10, as illustrated in FIG. 1, includes a thin, cylindrical plate 12 of semiconductor material, such as silicon. A large number of integrated circuits, generally indicated at 14, are formed on the surface of the wafer 10 by conventional semiconductor fabricating techniques. The integrated circuits 14 are typically arranged in rows and columns. After each of the integrated circuits is functionally tested, the wafer 10 is sliced along the rows and columns to form a large number of semiconductor "chips," each of which contains an integrated circuit.

The integrated circuit 14 includes a large number of transistors, diodes, and other electronic devices, generally indicated at 16. The circuit formed by the components 16 is connected by conductors to a plurality of bonding pads 18, generally arranged in a line along the sides of the integrated circuit 14. The bonding pads 18 are typically formed from a metal, such as aluminum. The integrated circuit chip 14 is normally mounted on a substrate, and the bonding pads 18 are connected to conductor pins through thin wires bonded to the pins and the bonding pads 18. The integrated circuit is then hermetically sealed by a ceramic or metal enclosure.

The integrated circuits 14 are actually substantially smaller than they are illustrated in FIG. 1. The extremely small size of each integrated circuit 14 results in bonding pads 18 that are spaced very close to each other. In order to perform functional tests on the integrated circuits 14 when they are still a part of the wafer 10, it is necessary to simultaneously make contact with all of the bonding pads 18 in a manner that does not interconnect adjacent bonding pads 18. Further, contact with the bonding pads 18 must be made very quickly in order to test the large number of integrated circuits 14 in a reasonable period of time. Integrated circuit probes that are used to make contact with the bonding pads must, therefore, have probe points that are precisely positioned to correspond to the positions of the bonding pads 18.

Figure 2:
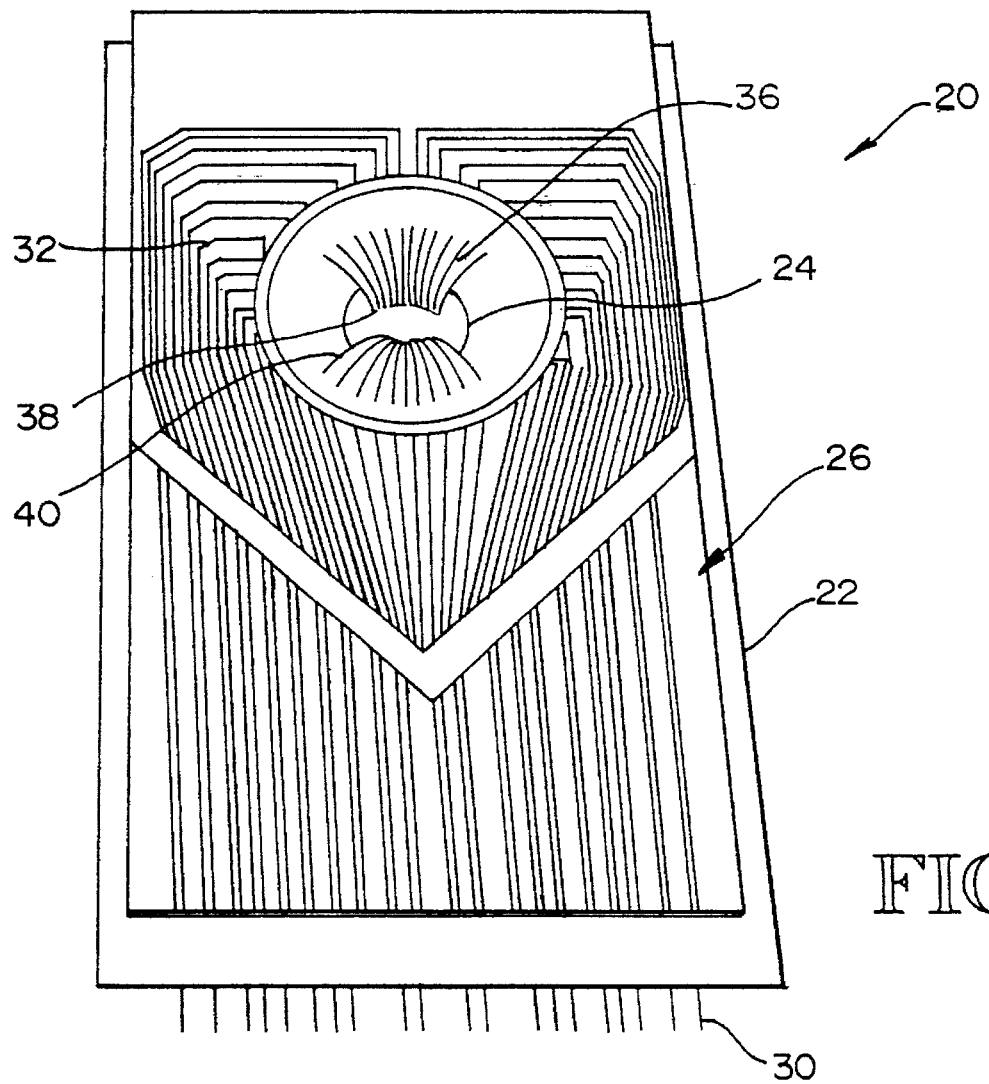
FIG. 2 is an isometric view of a conventional integrated circuit probe card used to test integrated circuits while they are still on a wafer.

A probe card used to make contact with the bonding pads 18 of integrated circuits 14 is illustrated in FIG. 2. The probe card 20 includes a conventional printed circuit board 22 having a circular cutout 24. Printed circuit conductors, generally designated by reference numeral 26, are formed on the board 22. The conductors 26 extend from one edge 30 of the board 22 to a plurality of pads 32 arranged around the circumference of the circular cutout 24. The printed circuit conductors 26 adjacent the edge 30 of the board 22 are adapted for insertion into a conventional printed circuit board edge connector (not shown). A plurality of probe wires 36 are bonded to respective mounting pads 32, such as by soldering. The wires 36 terminate in respective probe points 38 that together form a probe point array 40.

In operation, conventional electronic testing instrument are connected to the probe wires 36 through the conductors 26 and edge-mounted connector. Stimulus signals and power are then applied to the integrated circuit through the probe wires 36, and the responses to the stimulus are measured through the probe wires 36, conductors 26, and the edge-mounted connector. After the test has been completed, the probe array 40 is lifted from the bonding pads 18 of the integrated circuit 14 and moved over to another integrated circuit 14. The probe points 38 are then aligned with the mounting pads 18 of the integrated circuit and the probe card 20 is moved against the integrated circuit 14 until the probe wires 36 have been deflected by a predetermined value. Testing is then conducted on that integrated circuit 14. The above described procedure is repeated until all of the integrated circuits 14 have been tested.

Figure 3:
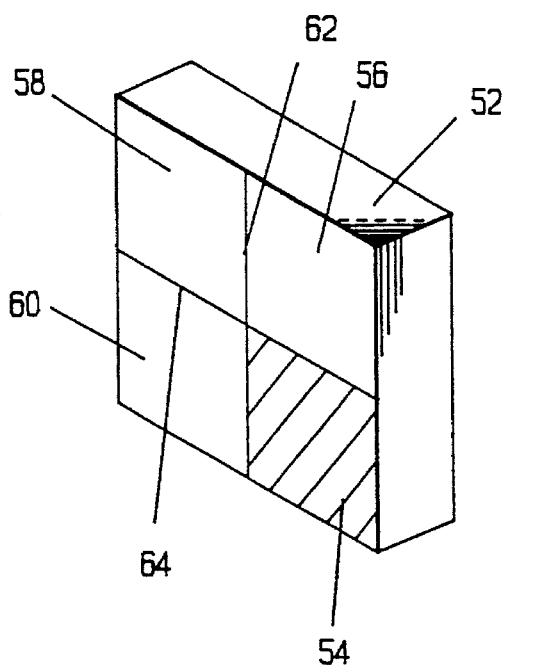
FIG. 3 is an isometric view of a checkplate used to inspect for probe point alignment in accordance with the present invention.

One embodiment of a checkplate that can be used to check the probe point alignment of probe cards is illustrated in FIG. 3. The checkplate 50 includes a plate 52 of rigid material, such as steel, which is preferably conductive. The upper surface of the plate 52 is divided into four quadrants, one of which is formed by a conductive surface 54 and the others of which are formed by insulating surfaces 56, 58, 60 separated from each other by conductive strips 62, 64. The conductive strips 62, 64 preferably make contact with the plate 52. Thus, a conductive object on the conductive quadrant 54 is electrically connected to the plate 52. However, conductive objects on the insulating surfaces 56, 58, 60 are electrically isolated from the plate 52. A conductor sliding along insulating surface 56 to insulating surface 58 is thus connected to the plate 52 only when it crosses the conductive line 62. Similarly, a conductor sliding along insulating surface 58 to insulating surface 60 is connected to the plate 52 only when it crosses conductive line 64.

Figure 4A:
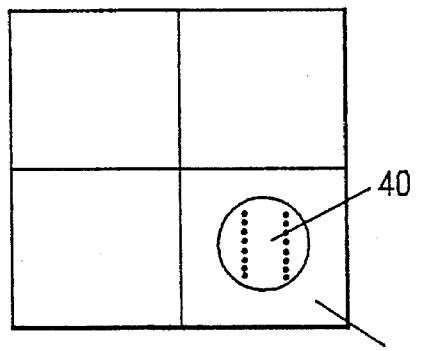
FIGS. 4a–4d are a mechanical schematic illustrating the manner in which probe point alignment is measured using the checkplate of FIG. 3.
Figure 4B:
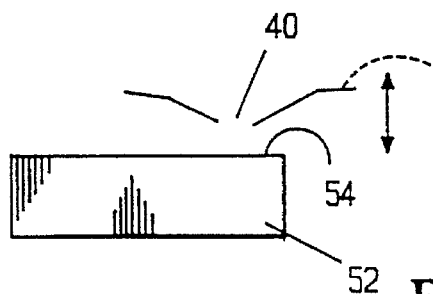

The manner in which the checkplate 50 is able to inspect the alignment of a probe point array along all 3 (X, Y and Z) axes is best illustrated in FIGS. 4a–4d. As illustrated in FIGS. 4A and 4B, the probe point array 40 is initially positioned above the conductive surface 54, and the probe point array 40 and conductive surface 54 are moved toward each other while the resistance between each of the probe wires 36 (FIG. 2) and the conductive plate 52 is measured. The position of the probe card 20 along an axis normal to the planar surface of the checkplate 50 is recorded when one of the probe points 38 first makes contact with the conductive surface 54. The identity of the particular probe point 38 making contact with the surface 54 is also, of course, recorded. In a similar manner, the probe point array 40 and the conductive surface 54 are incrementally brought together, and the position of the probe card 22 along an axis normal to the surface 54 is measured and recorded, as each of the probe points 38 makes contact with the conductive surface 54. The resulting record indicates the planarization, or Z-axis positions, of the probe point array 40. It will be understood, of course, that the Z-axis positions of the probe points can be measured either before or after the X-axis and Y-axis positions of the probe points are measured. Also, the checkplate 50 can be used solely to measure either the Z-axis positions of the probe points or the X-axis and Y-axis positions of the probe points.

If all of the probe points 38 make contact with the conductive surface 54 at substantially the same position of the probe card 22, then the planarization is considered to be very satisfactory. If, however, there is a substantial difference in the positions of the probe card 20 from the position at which the first probe point 38 makes contact with the planar surface 54 and when the last of the probe points 38 makes contact with the surface 54, then the degree of planarization may be considered unsatisfactory.

Figure 4C:
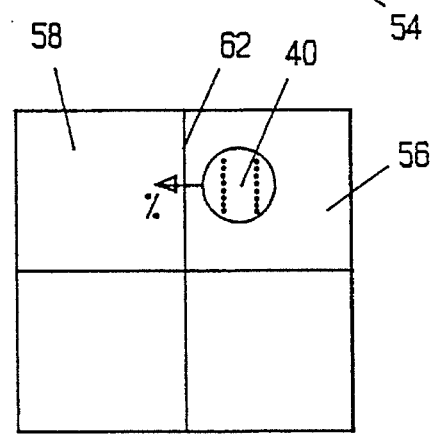

Before or after the planarization test has been conducted, the probe array 40 is placed over the insulating surface 56 near the conductive line 62, as illustrated in FIG. 4C. The probe point array 40 is then scanned across line 62 in the X direction. This scanning is accomplished by bringing the probe array 40 and the insulating surface 56 toward each other to deflect the probe points 38 to the same degree that they would be deflected if they were contacting the bonding pads 18 of an integrated circuit 14. Thus, the positions of the probe points 38 on the insulated surface 56 correspond to the positions that the probe points 38 would occupy on an integrated circuit 14 during test. After the probe points 38 have been deflected by a predetermined value, the resistance between each of the probe wires 36 (FIG. 2) and the conductive plate 52 is measured to determine if any of the probe points are contacting the conductive line 62. The probe points are then lifted from the insulative surface 56 and moved incrementally a small distance along the X-axis. The probe array 40 and the conductive surface 56 are once again brought together to deflect the probe points 38 by a predetermined value, and the resistance between each probe wire 36 and the conductive plate 52 is measured. Whenever any of the probe points 38 contact the conductive strip 62, the position of the probe card 20 is recorded. Also, when each of the probe points 38 subsequently moves off the conductive strip 62 onto the insulating surface 58, the position of the probe card 20 is measured and recorded.

After the probe array 40 has been moved along the X-axis so that all of the probe points 38 are contacting the insulating surface 58, two values of X will have been recorded for each probe point 38. The first value is the position of the probe card 20 when the probe point 38 first made contact with the conductive strip 62. The second value is the position of the probe card 20 when the probe point 38 lost contact with the conductive strip 62. These two values are averaged to provide a single value indicative of the relative position of the center of each probe point 38 in the probe point array 40. Further, the difference between the two values, less the width of the conductive strip, for each probe point 38 is an indication of the transverse dimension of that portion of the probe point 38 making contact with the checkplate along the X-axis.

Figure 4D:
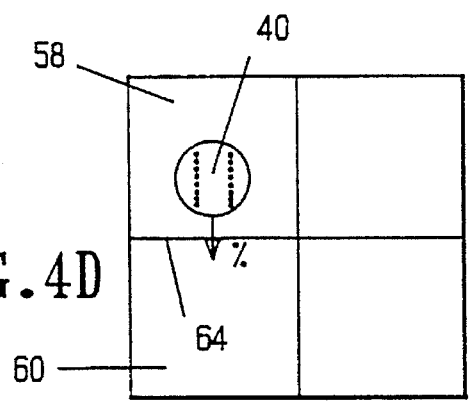

After a table of X values has been obtained for the probe point array 40, the probe point array 40 is placed over the insulating surface 58 near the conductive line 64, as illustrated in FIG. 4D. The probe point array 40 is then scanned over the conductive line 64 in the Y direction in the same manner that the array 40 was scanned over conductive line 62 in the X direction, as explained above with reference to FIG. 4C. The result is a table of two Y values for each probe point 38. The difference between these two Y values, less the width of the conductive strip, is indicative of the transverse dimension of the probe point 38 along the Y-axis, while the average between these two values provides a single Y value for the center of each probe point 38. After the probe point array 40 has been scanned across the conductive line 64 in the Y direction, a table indicative of the relative positions of each probe point 38 in two dimensions has been obtained.

While the conductive lines 62, 64 of the check plate 50 illustrated in FIGS. 3 and 4a–4d are orthogonal to each other, it will be understood that they may intersect each at an angle of other other than 90 degrees. However, using conductive lines 62, 64 that intersect each other at 90 degrees is preferred since it simplifies the derivation of X and Y values for each probe point 38.

Although conductive strips 62, 64 are used to determine the location of probe points in the embodiment of FIGS. 3 and 4a–4d, it will be understood that other designs may be used. For example, eliminating the conductive strips 62 and 64 and making the surface 58 conductive rather than insulating provides a conductivity transition border between surface 56 and 58 and between surface 58 and 60. This conductive transition border can be used to determine the X and Y locations of the probe points in a manner similar to the one explained above with reference to FIG. 4a–4d. However, using only one conductivity transition border (rather than two conductivity transition borders provided by conductive lines) does not allow the transverse dimensions of the probe points 38 to be determined, nor does it allow the centers of the probe points 38 to be determined by averaging two end values. Instead, the X and Y values correspond to the locations of the probe points 38 when they first make contact with the conductive surface 58. Other alternative embodiments of checkplates are described below.

One embodiment of a probe card inspection system is illustrated in FIG. 5. The inspection system 70 includes a conventional X,Y,Z table 72 mounted on a rigid machine base 74. The checkplate 50 is mounted on the X,Y,Z table 72 and connected to measuring electronics 76 through conductor 78. The probe card 20 is secured to probe card holders 80 that are mounted on the upper end of respective supports 82 extending upwardly from the machine base 74. The probe wires 36 extend downward from the probe card 20 to terminate in the probe points 38. The probe wires 36 are also connected to the measuring electronics 76 through the printed circuit conductors 26 (FIG. 2) and a multi-conductor cable 86. As described in greater detail below, the measuring electronics measure the resistance between the checkplate 50 and each of the probe wires 36. The measuring electronics 76 are connected to a conventional computer 90 operated by software that is described in detail described below. Computer 90 is connected to conventional circuitry 92 driving the X,Y,Z table 72 through a multi-conductor cable 94.

In operation, the computer 90 applies data to the control circuitry 92 to cause the table 72 to position the conductive surface 54 (FIG. 3) of the checkplate 50 beneath the probe point array 40. The table 72 then moves the checkplate 50 upwardly by small increments while the measuring electronics 76 monitor the resistance between the checkplate 50 and each probe wire 36. As the probe point 38 of each probe wire 36 makes contact with the checkplate 50, the measuring electronics 76 output identifying data to the computer 90. The computer 90 then records the Z axis position command that the computer 90 output to the table control 92. After all of the probe points 38 have made contact with the checkplate 50, the computer 90 has recorded a table of values indicative of the planarization of the probe point array 40.

The table 72, controlled by the computer 90 through the table control 92, then moves the checkplate 50 to the position illustrated in FIG. 4C and scans the probe point array 40 across the conductive line 62 while the measuring electronics 76 measure the impedance between each probe wire 36 and the checkplate 50. When each probe wire 36 makes contact and then loses contact with the conductive line 62, the measuring electronics 76 output data identifying the probe wire 36 to the computer 90. The computer 90 then records these two values along with the X position command output by the computer 90 when the two X values were recorded. The computer 90 can then determine the center position of the probe point 38 and the transverse dimension of the probe point 38 along the X axis. The table 72, acting under control of the computer 90 through the table control 92, then moves the probe array 40 to the position illustrated in FIG. 4D and scans the probe array 40 across the conductive line 64 in Y direction. The computer 90 records two Y values for each probe point and calculates the center position and transverse dimension in the Y direction for each probe point 38, as described above with reference to the X axis measurements.

Figure 6:
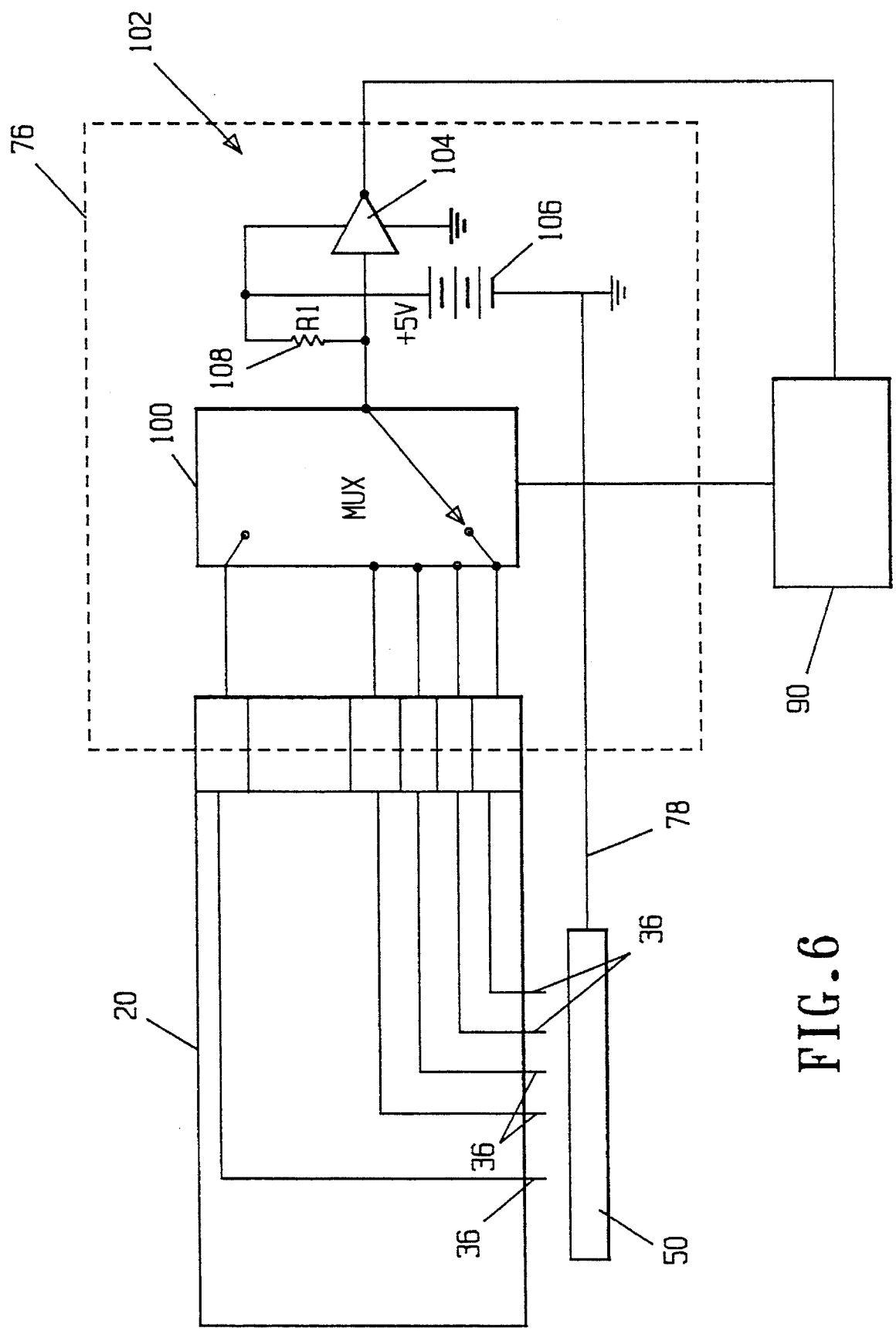
FIG. 6 is an electrical schematic of an electrical circuit used in the embodiment of FIG. 5.

The measuring electronics 76 are illustrated in FIG. 6 along with the checkplate 50, probe card 20, and computer

90. The measurement electronics 76 basically consist of a conventional integrated circuit multiplexer (MUX) 100 having each of its inputs connected to a respective probe wire 36. The output of the multiplexer is applied to a buffer 102 formed by an inverter 104 having its input biased high by battery 106 through resistor 108. The checkplate 50 is connected to ground through conductor 78. The multiplexer 100 is controlled by a byte of data received from the computer 90. The computer 90 sequentially connects each of the probe wires 36 to the input of the inverter 104 according to the value of the control byte output to the multiplexer 100 by the computer 90. When the input of inverter 104 is initially connected to the probe wires 36, a high logic level is applied to the probe wire 36 through a resistor 108 since the probe points 38 have not yet contacted the conductive line 62 (FIGS. 3 and 4a–4d). As a result, the inverter 104 will apply a logic "0" to an I/O port of the computer 90. When each probe wire 36 contacts a conductive surface of the checkplate 50, the probe wire 36 is grounded, thereby pulling the input to inverter 104 low to logic "0." The inverter 104 then applies a logic "1" to the I/O port of the computer 90. The computer 90 causes the multiplexer 100 to connect each of the probe wires to the input of the inverter 104 to determine if each of the probe wires 36 is connected to a conductive or nonconductive surface of the checkplate 50. The probe wires 36 are associated with the current output of the inverter 104 by the value of the control signal that the computer 90 applies to the multiplexer 100. For example, if the output of inverter 104 is at logic "1" when the computer 90 causes the multiplexer 100 to be connected to probe point number 10, the computer 90 can determine that probe point number 10 is connected to a conductive surface of the checkplate 50. The computer 90 is thus able to determine when each of the probe wires 36 makes contact with a conductive surface of the checkplate 50.

Figure 7A:
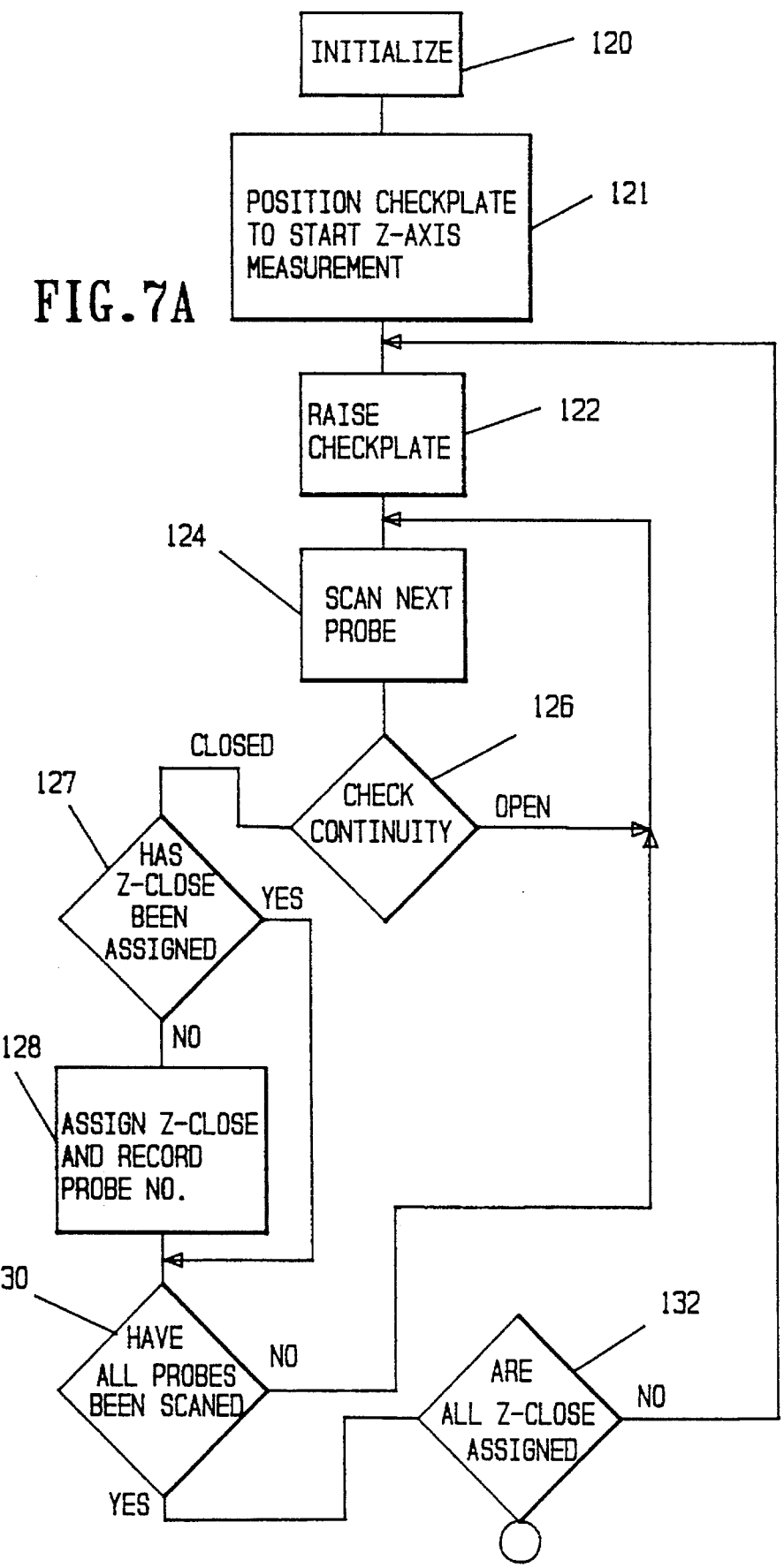
FIGS. 7A and 7B are flow charts of the software controlling the operation of the embodiment of FIG. 5.
Figure 7B:
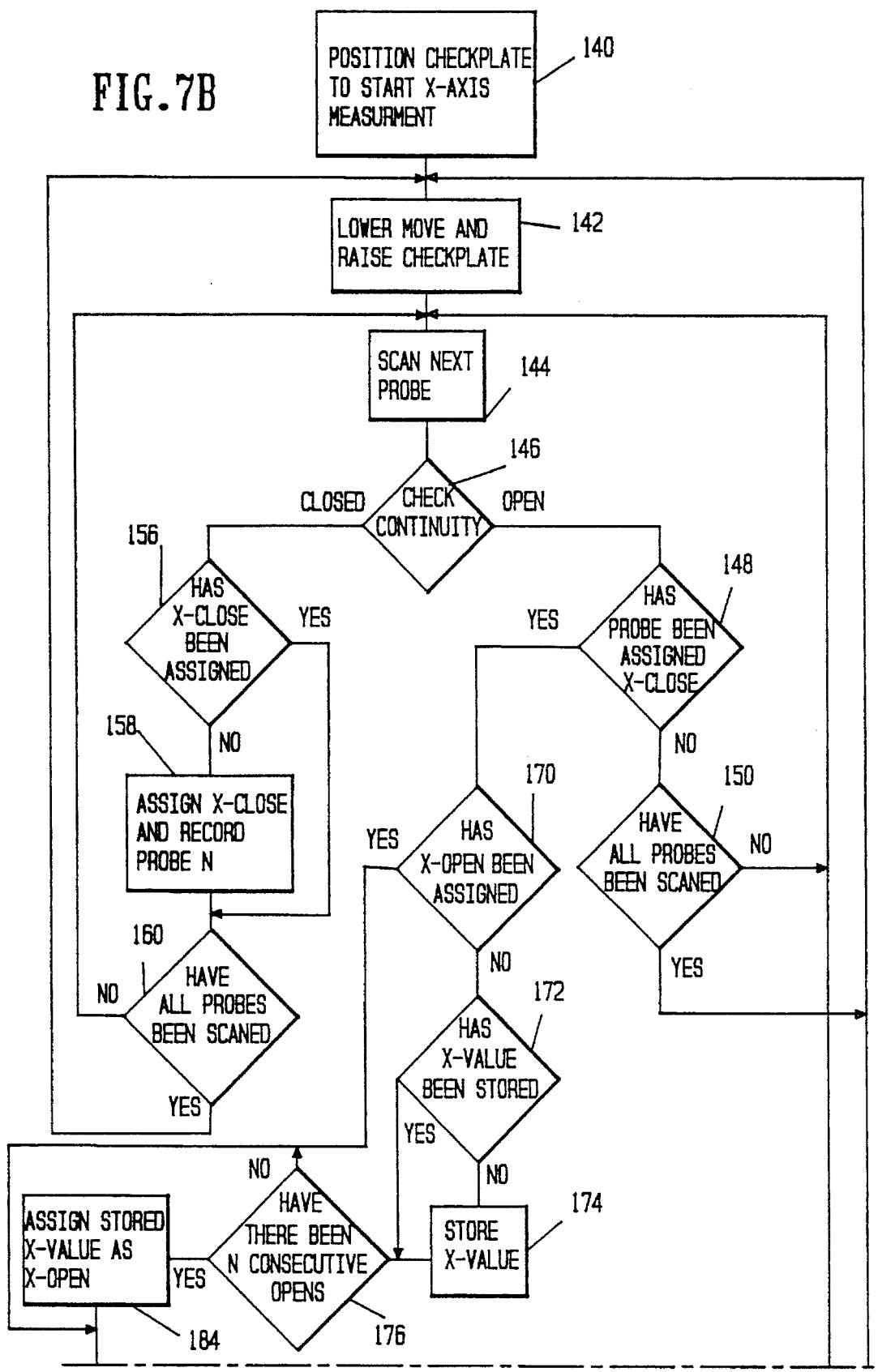
Figure 7B:
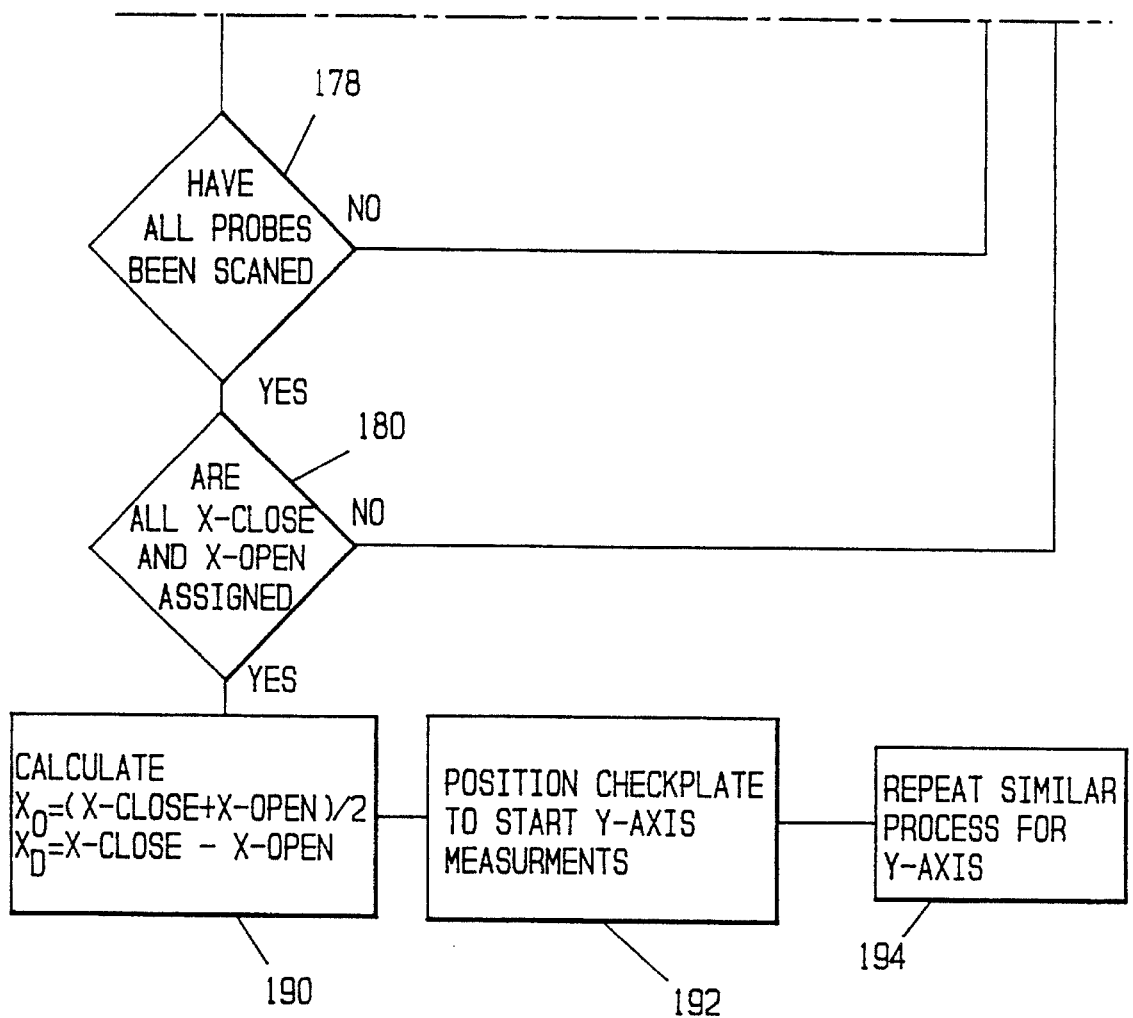

As mentioned above, the computer 90 can be any of several commercially available computer systems. Further, it may be easily programmed in any of several conventional programming languages in accordance with the flow chart illustrated in FIG. 7. With reference to FIG. 7, the program is initiated at 120 and immediately positions the conductive surface 54 of the checkplate 50 beneath the probe array 40. The checkplate 50 is raised an incremental amount at 122 to bring the checkplate 50 and probe points 38 closer together. The multiplexer 100 switches the first probe wire 38 to the input of the inverter 104 at 124, and the output of the inverter 104 is checked at 126. If the output of the inverter 104 is low, indicating that the probe wire is not contacting the checkplate 50, the program returns to 124 to cause the multiplexer 100 to check the next probe wire. If the output of the inverter 104 is found to be high at 126, the program branches to 128, where the identity of the probe point 38 and the current Z axis value of the checkplate 50 are recorded. The program then determines at 130 whether the multiplexer 100 has scanned all of the probe wires. If all of the probe wires have not been scanned, the program returns to 124 to increment the multiplexer 100 so that it scans the next probe wire. If all of the probe wires 36 have been scanned, the program checks at 132 to determine if all of the probe wires 36 have been read, i.e., if all of the probe points 38 have contacted the checkplate 50. If some of the probe points 38 have not yet contacted the conductive surface 54 of the checkplate 50, the program returns to 122 in order to increment the X,Y,Z table in the Z direction and raise the checkplate 50 an incremental amount. When all of the probe points 38 have contacted the checkplate 50, the positions of all probe points 38 relative to each other along the Z axis have been determined. The computer 90 can then calculate the planarization of the probe card 20.

After the Z axis planarization measurements have been made, the program branches from 132 to 140 to position the checkplate so that the probe array 40 is above the insulating surface 56 adjacent conductive line 62, as illustrated in FIG. 4C. The computer 90 actuates the X,Y,Z table 72 at 142 to move it an incremental distance in the X direction and raise the checkplate 50 to deflect the probe wires by a predetermined value. The computer 90 then causes the multiplexer 100 (FIG. 6) to scan the first probe wire 36 at 144. The continuity of that probe wire 36 is then checked at 146. During the initial portion of the X position measurements, the probe points 38 will be contacting the insulated surface 56 of the checkplate 50. The continuity check at 146 will thus indicate an open probe point 38, and the program will therefore branch to 148 to determine if an "X-CLOSE" value has been assigned to the probe. An "X-CLOSE" value is assigned to the probe point 38 when the probe point 38 contacts the conductive line 62. Thus, each of the probe points 38 will initially not have an "X-CLOSE" value assigned to it, and the program will branch to 150. The program determines at 150 if the multiplexer 100 has scanned all of the probe wires 36. Thus, after each probe wire 36 has been scanned, the program will return from 150 to 144 to scan the next probe wire 36 until the final probe wire has been scanned.

When all of the probe wires 36 have been scanned, the program will branch from 150 back to 142 to lower the checkplate 50, incrementally move the checkplate 50 in the X direction and then raise the checkplate 50 at 142. Continuity of each of these probe wires 36 is once again checked at 146. When each of the probe points 38 contacts the conductive line 62, the conductivity check at 146 indicates a closed condition, thereby causing the software to branch to 156. The program determines at 156 if an "X-CLOSE" value has previously been assigned to the probe wire 36 currently being scanned. If an "X-CLOSE" value has not previously been assigned, an "X-CLOSE" value is assigned at 158. If an "X-CLOSE" value for the currently scanned probe wire 36 has previously been assigned, the program skips to 160. The program ,.rill branch from 156 directly to 160 as the probe point 38 moves across the conductive line 62 after an "X-CLOSE" value has been assigned to the probe point 38 when the probe point 38 first contacts the conductive line 62. The program determines at 160 if the multiplexer 100 has connected all of the probe wires 38 to the inverter 104. If the multiplexer 100 has not yet scanned all of the probe wires 36, the program branches to 144, where the multiplexer 100 is incremented to the next probe wire 36, and the continuity of that probe wire 36 is checked at 146. After all of the probe wires 36 have been scanned, the program branches from 160 to 142 to lower the checkplate 50, incrementally move the checkplate in the X direction, and then raise the checkplate to deflect the probe wires 36 by a predetermined value.

After the probe points 38 move from the insulating surface 56 to the conductive surface 62, they will eventually contact the insulating surface 58 as the probe array 40 moves across the conductive line 62 in the X direction. Thus, after a closed continuity is detected at 156 for each probe wire 36, an open continuity will subsequently be detected when the probe point 38 contacts the insulating surface 58. At this time, the software will branch to 148 to determine if an "X-CLOSE" has been previously been assigned. In order for the probe point 38 to reach the insulating surface 58, it must have made contact with the conductive line 62 so that an "X-CLOSE" value will have been assigned. Accordingly, the program will branch to 170 to determine if an "X-OPEN" value has previously been assigned. When the probe point first makes contact with the insulating surface 58, an "X-OPEN" value will not have been assigned. The program will thus branch to 172 to determine if an X value has been stored in a temporary register. Once again, when the probe point first contacts the insulating surface 58, an X value will not have been stored. As a result, the current position of the checkplate 50 is stored at 174, and a check is made at 176 to determine how many consecutive "opens" have been detected at 146. When the probe point first contacts the insulating surface 58, there will be only a single probe location in which an "open" has been detected. Thus, the program will initially branch to 178 to determine if all of the probe wires 36 have been scanned. If all of the probe wires 36 have not been scanned, the program will return to 144 to cause the multiplexer 100 to check the next probe wire 36 until all of the probe wires 36 have been checked, at which point the program will branch to 180. The program determines at 180 whether "X-CLOSE" and "X-OPEN" values have been assigned to all of the probe wires 36. As the probe points 38 initially contact the insulating surface 58, "X-OPEN" values will not have been assigned to the probe wires 36. Thus, the program will branch to 142 to lower the checkplate 50, move it an incremental distance, and then once again raise the checkplate 50 against the probe array 40. For a probe point 38 contacting the insulating surface 58, the program will branch through 144, 146, 148, 170 and 172 to 176. After the probe point 38 has made contact with the insulating surface 58 "N" number of times, the program will branch from 176 to 184 to assign the X value temporarily stored at 174 as the "X-OPEN" value. Thus, when the probe point 38 initially contacts the insulating surface 58, the position of the checkplate 50 at that point is temporarily stored. If the continuity of that probe point 38 continues to be open for "N" measurements, the position of the checkplate 50 when the probe point 38 initially contacted the insulating surface 58 is recorded as the "X-OPEN" value for that probe. The purpose of validating the X value as a true "open" is to prevent momentary loss of contact resulting from dirt, etc., on the checkplate 50 from registering as an "X-OPEN" value when the probe point is still contacting the conductive line 62.

After the program determines at 180 that all of the probes have been assigned an "X-CLOSE" and an "X-OPEN" value, the program calculates the position of each probe point along the X axis $X_0$ and the transverse dimension of the probe point along the X axis $X_D$ at 190. The probe point position $X_0$ is calculated as one-half the sum of the "X-CLOSE" and "X-OPEN" value for that probe point 38, i.e., the average between the position of the probe point 38 when it initially contacts the conductive line 62 and its position when it initially contacts the insulating surface 58. The transverse dimension $X_D$ of the probe point 38 is calculated as the difference between "X-CLOSE" and "X-OPEN", less the width of the conductive strip, for that probe point 38. After all of the X values are calculated at 190, the program branches to 192 to position the checkplate so that the probe array 40 is over the insulating surface 58 near the conductive line 64, as illustrated in FIG. 4D. The above-described procedure for scanning across the conductive line 62 to obtain X values is then repeated at 194 to scan the probe array 40 across conductive line 64 to obtain Y values.

Figure 8:
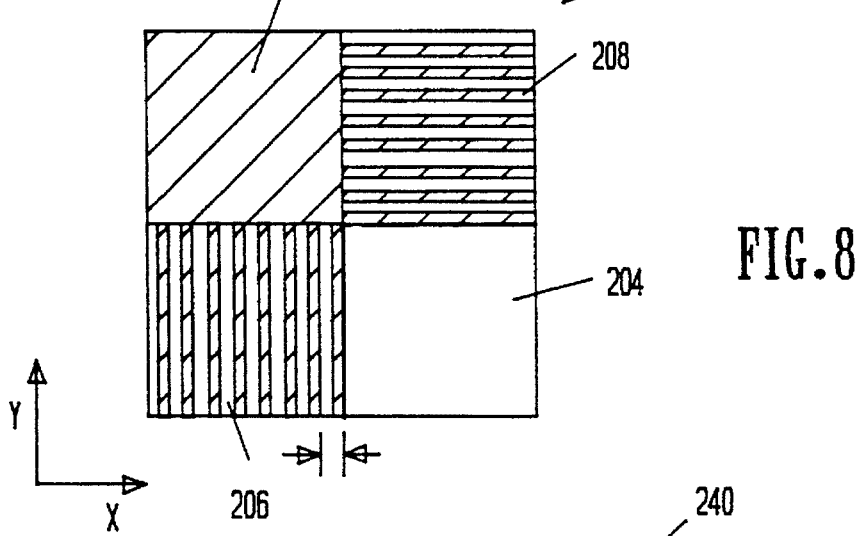
FIG. 8 is a top plan view of an alternative embodiment of a checkplate that can be used in the inspection machine of FIG. 5.

An alternative embodiment of a checkplate 200 is illustrated in FIG. 8. As in the checkplate 50, the alternative checkplate 200 is in the form of a single conductive square 202. However, instead of utilizing three insulating squares 56, 58, 60 separated from each other by conductive lines 62, 64, the alternative checkplate 200 utilizes a single insulating square 204 and two squares 206, 208 of alternating conductive and insulating lines or strips. The strips in the square 206 extend in the Y direction and are used for measuring the X positions and transverse X dimensions of the probe array 40. The strips in the square 208 extend along the X axis and are used to measure the Y positions and transverse Y dimensions of the probe array 40. The primary advantage of using the check plate 200 illustrated in FIG. 8 is that is necessary to move the checkplate 200 for an X and Y distance of approximately the width of one conductive strip and one insulating strip in order to measure all of the probe point positions. The conductive strips are preferably wired separately so that it is possible to uniquely identify the conductive strip and, therefore, the unique X position, that each probe point 38 is contacting.

Figure 9:
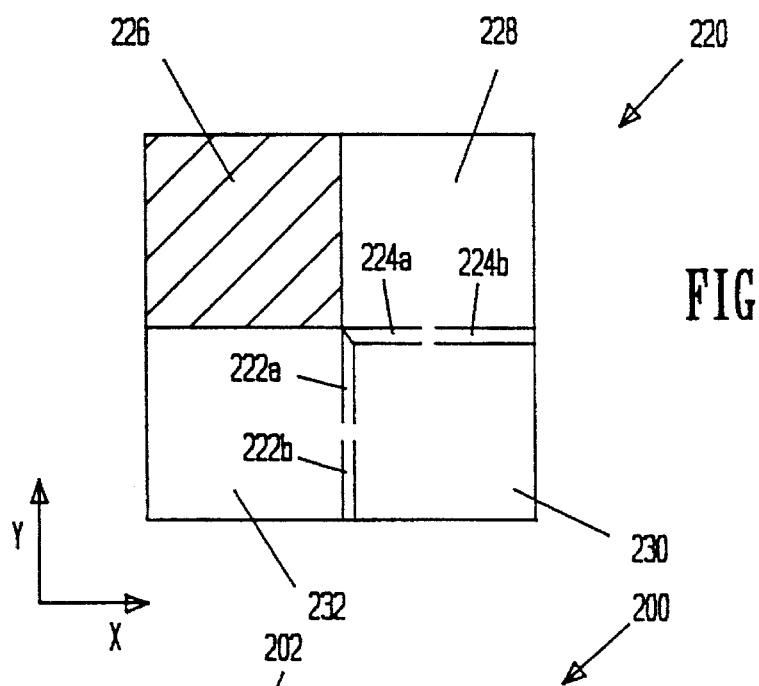
FIG. 9 is a top plan view of another alternative embodiment of a checkplate that can be used in the inspection machine of FIG. 5.

Another alternative embodiment of a checkplate 220 is illustrated in FIG. 9. This checkplate 220 is similar to the checkplate 50 shown in FIG. 3, except that it utilizes conductive strips 222 for X axis measurements that are divided into two electrically isolated strips 222a, 222b. Similarly, strips 224a, 224b are electrically isolated from each other and used to make the Y axis measurements. As in the checkplate 50, the alternative checkplate 220 utilizes a single conductive square 226 and three insulative squares 228, 230, 232 which are separated from each other by the conductive strips 222, 224. Utilizing conductive strips divided in two and electrically isolated from each other allows measurements to be made on probe cards that have their probe wires 36 positioned on opposite sides of the probe array 40 wired together. In this embodiment, the probe points 38 on one side of the array 40 have their X values determined by strip 222a and their Y values determined by strip 224a. The probe points 38 on the opposite side of the array 40 have their X values measured by strip 222b and their Y values measured by strip 224b.

Figure 10:
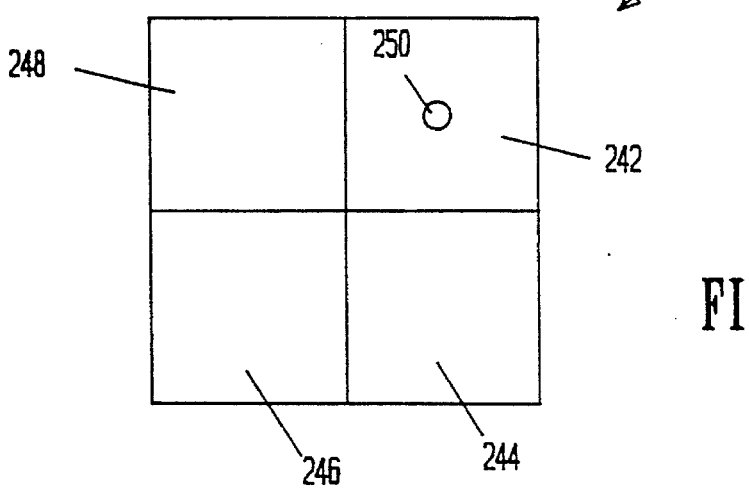
FIG. 10 is a top plan view of another alternative embodiment of a checkplate that can be used in the inspection machine of FIG. 5.

Still another embodiment of the checkplate 240 is illustrated in FIG. 10. The checkplate 40 utilizes any of the combinations of conductor and insulator described above, and has the addition of a small dot 250 of conductive material formed thereon that is electrically isolated from the other conductors and is wired out to a separate terminal. The probe array 40 may be scanned across the dot 250 so that each of the probe points 38 sequentially contacts the dot 250. The dot 250 should be small enough that two probe points 38 cannot contact the dot 250 at the same time. The checkplate 240 of FIG. 10 allows the alignment of probe cards 20 to be checked in which some of the probe wires 36 are wired to each other. The alignments of probe points 38 are checked by scanning the probes across the dot 250 in a manner analogous to scanning probe points with the conductive strips 62 and 64.

The dot 250 may also be used as an aid in probe card 20 rework. This could be done by first measuring the alignment of all the probe points 38 in the manner described above. Next, a probe point 38 that required rework, or bending, to bring it into alignment relative to the other probe points 38, would be positioned over the dot 250 in such a way that the dot 250 is positioned where the probe point 38 would be if it were accurately aligned. An operator, looking through a microscope, would see the displacement of probe point 38 from the dot 250 and would use a tweezers to bend the probe point 38 into position over the center of the dot 250. The dot 250 could then be further used to check the position of the reworked probe point 38 to measure the success of the rework operation and again positioned for further rework if required.

An alternative embodiment of the checkplate would be to replace the insulating squares with conducting squares and to replace the conducting strips with insulating strips., This alternative checkplate would be used in the same manner as the one described above but has the disadvantage that it cannot determine the x and y locations of probe points that are wired together on the probe card.

The checkplates 50, 200, 220, 240 can be manufactured utilizing a number of known manufacturing techniques. One manufacturing technique is to cut a thin sheet (e.g., 0.01 inch) of a suitable material, such as tungsten carbide, into strips about 0.1 inch wide. The upper surface of a relatively thick plate of steel is then divided into four quadrants by machining grooves into its upper surface, the grooves having a width of about 0.05 inch. The strips cut from the plate are then turned on their edge and inserted into the grooves in the plate and secured by filling the grooves with a suitable conductive epoxy. Three squares formed from a sheet of insulating material are then forced against the strips and secured to three quadrants of the plate with a suitable adhesive. Finally, a square formed from a conductive sheet is secured to the remaining quadrant of the plate, with its edges contacting the adjacent strips. The upper surface of the checkplate should be very hard and smooth so that it is not worn down by the probe points 38 nor does it cause any significant wear of the probe points 38. Thus, after the checkplate is fabricated as described above, it is preferably polished to a fine surface finish.

Checkplates can also be manufactured by other processes, such as by using photolithographic techniques to deposit or otherwise create a thin layer of an insulator on the surface of a conductor or a thin layer of conductor on an insulator. The boundary shapes of the deposits defining conductive transition borders would be defined by a photolithographic mask. Suitable chemical etching techniques can also be used.

It should be noted that since the above-described checkplates can be used to determine the location of probe points 38, they can also be used to manufacture probe cards 20. Probe cards 20 can be manufactured by clamping each probe wire 36 in sequence in a holder. The checkplate would be positioned, by the X,Y,Z table, at the probe point, in a prescribed sequence, to determine the exact location of the point relative to the holder features. This information would then be used to position the probe card in the proper position relative to the point and the probe would then be attached to the circuit board 22. The next probe wire 36 is then held by the holder and its probe point 38 found and placed at the proper location on the circuit board and attached. The above process is repeated until all of the probe wires have been attached to the printed circuit board 22.

The data specifying the locations of the probe points 38 which are obtained using the checkplates can also be used to align the probe card 20 with the integrated circuits on a wafer during testing. After the probe point position measurements have been made with the system described in FIGS. 5–7, the location of each probe point 38 with respect to indexing features on the probe card is known. A "reference file" of data indicative of where each bonding pad on the chip will be located is also obtained for integrated circuits prior to manufacture. Thus, each integrated circuit type has its own reference file. The centroid of the integrated circuit can be obtained by averaging the positions of the bonding pads for the integrated circuit. Similarly, the centroid of the probe point array 40 can be obtained by averaging the positions of the probe points 38. The centroid of the probe array 40 can then be aligned with the centroid of the reference file and a comparison made between the locations of the bonding pads 18, as designated by the reference file, with the measured positions of the probe points. A comparison between the location of the bonding pads 18 and respective probe points 38 allows an angle error to be calculated for each probe point/bonding pad pair. After all of the angle errors have been calculated for the reference point/bonding pad pairs, an average angle can be calculated. When the probe card 20 is used to test integrated circuits on the wafer, the probe card 20 can then be rotated by the average angle error to provide the optimum fit between the probe point array 40 and the bonding pads 18. In a similar manner, the wafer can be offset by the X and Y errors, relative to the indexing features, to provide the optimum X and Y fit of the array to the bonding pads.

It is thus seen that the inventive method and apparatus for inspecting integrated circuit probe cards allows all important electrical and mechanical parameters of probe cards to be inspected prior to placing a corresponding integrated circuit into production. Furthermore, it may be used to manufacture probe cards and optimizes the use of the probe cards in testing integrated circuits.

We claim:

1. A system for inspecting an integrated circuit probe card having a plurality of probe wires terminating in respective probe points arranged in a probe point array, said system comprising:

an X-Y table;

a checkplate mounted on said X-Y table, said checkplate having a planar measurement surface and a measurement border formed on said measurement surface;

mounting means for mounting said probe card adjacent said checkplate with said probe points contacting the measurement surface of said checkplate;

control means for driving said X-Y table to cause said probe point array to scan across the measurement surface of said checkplate from one side of said measurement border to the other;

sensing means for determining when said probe points crosses said measurement border from one side to the other; and means for recording the location of said checkplate relative to said probe card when said sensing means determines that each of said probe points crosses said measurement border.

2. The inspection system of claim 1 wherein said sensing means senses the resistance between each of said probe points and a portion of said checkplate.

3. A checkplate usable for inspecting integrated circuit probe cards having a plurality of probe wires terminating in respective probe points arranged in a probe point array, said checkplate comprising a measurement surface having a measurement border formed thereon, and bisecting said measurement surface so that said measurement surface extends from opposite sides of said measurement border, said measurement surface being planar from one side of said measurement border to the other so that said probe points can easily slide across said measurement surface from ode side of said measurement border to the other said checkplate having means for determining on which side of said measurement border said probe points contact said measurement surface.

4. The checkplate of claim 3 wherein said measurement border divides said measurement surface into two portions which are at least partially electrically isolated from each other and wherein said checkplate further includes a measurement terminal electrically coupled to one portion of said measurement surface so that the resistance between said measurement terminal and said measurement surface varies between two values on opposite sides of said measurement border.

5. A method of inspecting an integrated circuit probe card having a plurality of probe wires terminating in respective probe points arranged in a probe point array, said method comprising:

providing a checkplate having a planar measurement surface and a measurement border formed on said measurement surface;

scanning said probe points across the measurement surface of said checkplate from one side of said measurement border to the other;

determining when each of said probe points crosses said measurement border during said scan; and monitoring the position of said probe card relative to said checkplate to determine the position of said probe card relative to said checkplate when each of said probe points crosses said measurement border, thereby determining the positions of said probe points relative to each other.

6. The method of claim 5 wherein said measurement border divides said measurement surface into two portions which are at least partially electrically isolated from each other and wherein said checkplate further includes a measurement terminal electrically coupled to one portion of said measurement surface so that the resistance between said measurement terminal and said measurement surface varies between two values on opposite sides of said measurement border, and wherein said step of determining when each of said probe points crosses said measurement border during said scan is accomplished by sensing the resistance between each of said probe points and said measurement terminal during said scan.

\* \* \* \* \*

UNITED STATES PATENT AND TRADEMARK OFFICE
CERTIFICATE OF CORRECTION

PATENT NO. : 5,508,629
DATED : April 16, 1996
INVENTOR(S) : John P. Stewart, et. al.

It is certified that error appears in the above-indentified patent and that said Letters Patent is hereby corrected as shown below:

Column 14, line 61, delete the word "ode" and insert the word --one--.

Signed and Sealed this

Twenty-seventh Day of August, 1996

Attest:

BRUCE LEHMAN

Attesting Officer

Commissioner of Patents and Trademarks